United States Patent [19]
Lin

[11] Patent Number: 5,983,084
[45] Date of Patent: Nov. 9, 1999

[54] TRANSMITTER HAVING AN IMPROVED LC OSCILLATOR

[75] Inventor: Xing Ping Lin, Commerce Township, Mich.

[73] Assignee: TRW Inc., Lyndhurst, Ohio

[21] Appl. No.: 08/870,188

[22] Filed: Jun. 6, 1997

[51] Int. Cl.⁶ .................................................. H04B 1/04
[52] U.S. Cl. ........................................ 455/114; 455/118
[58] Field of Search .................................... 455/113, 114, 455/118, 119, 120, 127

[56] References Cited

U.S. PATENT DOCUMENTS

| | | | |
|---|---|---|---|
| 3,882,424 | 5/1975 | Debois et al. | 455/120 |
| 4,068,173 | 1/1978 | Weise | 455/118 |
| 4,635,296 | 1/1987 | Dinsmore | 455/113 |
| 4,710,970 | 12/1987 | Wu et al. | 455/113 |
| 4,794,622 | 12/1988 | Isaacman et al. | |
| 4,881,148 | 11/1989 | Lambropoulos et al. | |

*Primary Examiner*—Dwayne D. Bost
*Assistant Examiner*—Quochien B. Vuong
*Attorney, Agent, or Firm*—Tarolli, Sundheim, Covell, Tummino & Szabo LLP

[57] ABSTRACT

A transmitter for use with a receiver responsive to a function request signal transmitted by said transmitter for performing a requested function. The transmitter includes a controller for providing a function command and an LC oscillator for providing the request signal at a fixed frequency in response to the command from the controller. The oscillator includes a semi-conductor having first, second, and third electrodes and a tank circuit including first, second, and third impedances. A surface acoustic wave resonator is connected from the first electrode to ground. A feedback capacitor is connected from the second electrode to said first electrode for reducing spurious frequency signals.

12 Claims, 2 Drawing Sheets

TRANSMITTER HAVING AN IMPROVED LC OSCILLATOR

FIELD OF THE INVENTION

The present invention relates to the art of transmitters and, more particularly, to a transmitter for use with a receiver that responds to a function request signal transmitted by the transmitter for performing a requested function, such as the opening of a garage door or a vehicle door.

DESCRIPTION OF THE PRIOR ART

Transmitters are known in the art for transmitting information to a receiver that responds by performing a requested function. Systems that perform these functions include those for operating garage doors as well as those for operating vehicle doors. The systems that operate vehicle doors are sometimes known as remote keyless entry (RKE) systems. Such systems include a receiver mounted in a motor vehicle and a portable hand-held transmitter located remote from the receiver. The receiver has a memory that stores one or more security codes, each of which identifies a transmitter that is authorized entry into the vehicle. The transmitter transmits a request signal that includes a security code which uniquely distinguishes the transmitter from a plurality of similar transmitters and a function code representative of a control function to be performed. When the receiver receives such a request signal, it compares the received security code with each stored security code to determine whether the security code was transmitted by an authorized transmitter. If a match takes place, the receiver responds by causing performance of the control function requested, as by unlocking a vehicle door. A system as described above is disclosed in the U.S. patent to Lambropoulos et al. U.S. Pat. No. 4,881,148, a disclosure of which is herein incorporated by reference.

A transmitter known from the prior art and suitable for use in such an RKE system is disclosed in FIG. 1. This transmitter, as will be described in greater detail hereinafter, incorporates an LC oscillator stage for providing a carrier wave signal having a fixed frequency on the order of 315 MHz. A surfaced acoustic wave resonator is connected to the oscillator to control and stabilize the oscillator frequency at the intended value of 315 MHz. Two 3 volt batteries BI and B2 are used to provide a 6 volt supply to the oscillator. These batteries are fairly large in size, requiring that the transmitter housing be large. It is desired to replace the two batteries with a single 3 volt battery to reduce the size of the transmitter housing. If a single 3 volt battery is employed then either the bias circuit for the oscillator must be adjusted to increase the magnitude of the current flowing through transistor Q1 or an amplifier must be connected to the output of the oscillator in order to achieve the same output power as done with two batteries. The transmitter disclosed in the U.S. patent to Isaacman et al U.S. Pat No 4,794,622 is very similar to the prior art transmitter of FIG. 1 herein.

However, during each start up operation of the oscillator, spurious signals will exist and which have frequencies close to the operating frequency of 315 MHz. If the oscillator bias circuit is adjusted or an amplifier is employed, these spurious signals will be amplified. These spurious signals will be sufficiently strong during each start up operation that they may interfere with the proper operation of an RKE transmitter and may not be within allowable limits set by the FCC (Federal Communications Commission).

These spurious signals occur during each start up time of the oscillator before the SAW resonator has stabilized the operation. The present invention is directed towards reducing such spurious signals by employing capacitive feedback for the oscillator.

SUMMARY OF THE INVENTION

In accordance with the present invention, a transmitter is provided for use with a receiver responsive to a function request signal transmitted by the transmitter for performing a requested function. The transmitter includes a controller for providing a function command. An LC oscillator provides the request signal at a fixed frequency in response to the function command. The oscillator includes a semiconductor having first, second and third electrodes and a tank circuit including first and second impedances. The first impedance is connected between the second and third electrodes. The second impedance is connected from the third electrode to ground. A third impedance is connected from a voltage source to the second electrode. A surface acoustic wave resonator is connected from the first electrode to ground. A feedback capacitor is connected from the second electrode to the first electrode for reducing spurious signals.

BRIEF DESCRIPTION OF THE DRAWINGS

The foregoing and other objects of the invention will become more readily apparent from the following description of the preferred embodiment of the invention as taken in conjunction with the accompanying drawings which are a part hereof and wherein.

DESCRIPTION OF PREFERRED EMBODIMENTS

Reference is now made to the drawings wherein the showings are for purposes of illustrating a preferred embodiment of the invention only, and not for the purpose of limiting same.

Figure 1:
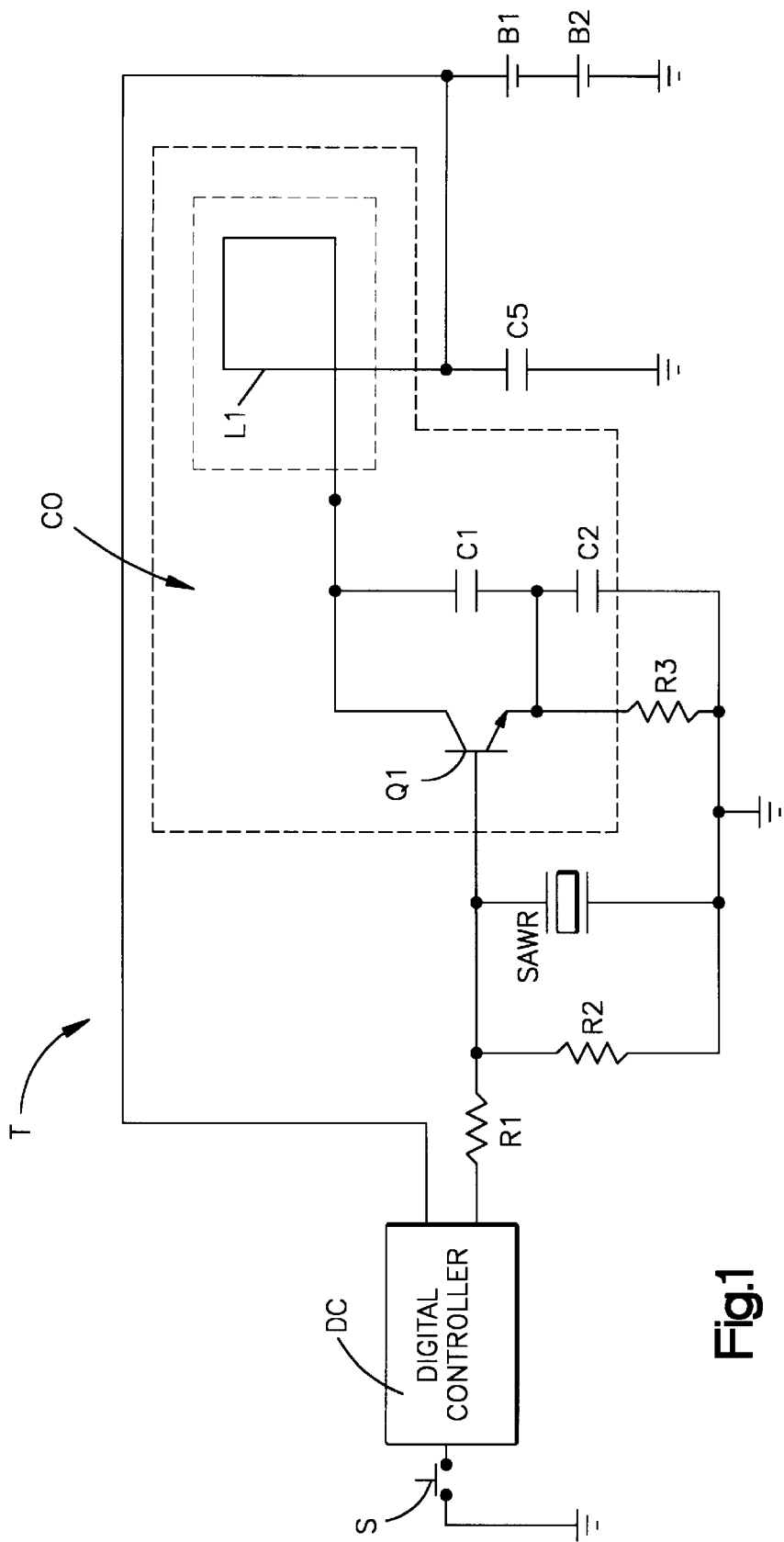
FIG. 1 is a schematic-block diagram illustration of a prior art portable transmitter.
Figure 2:
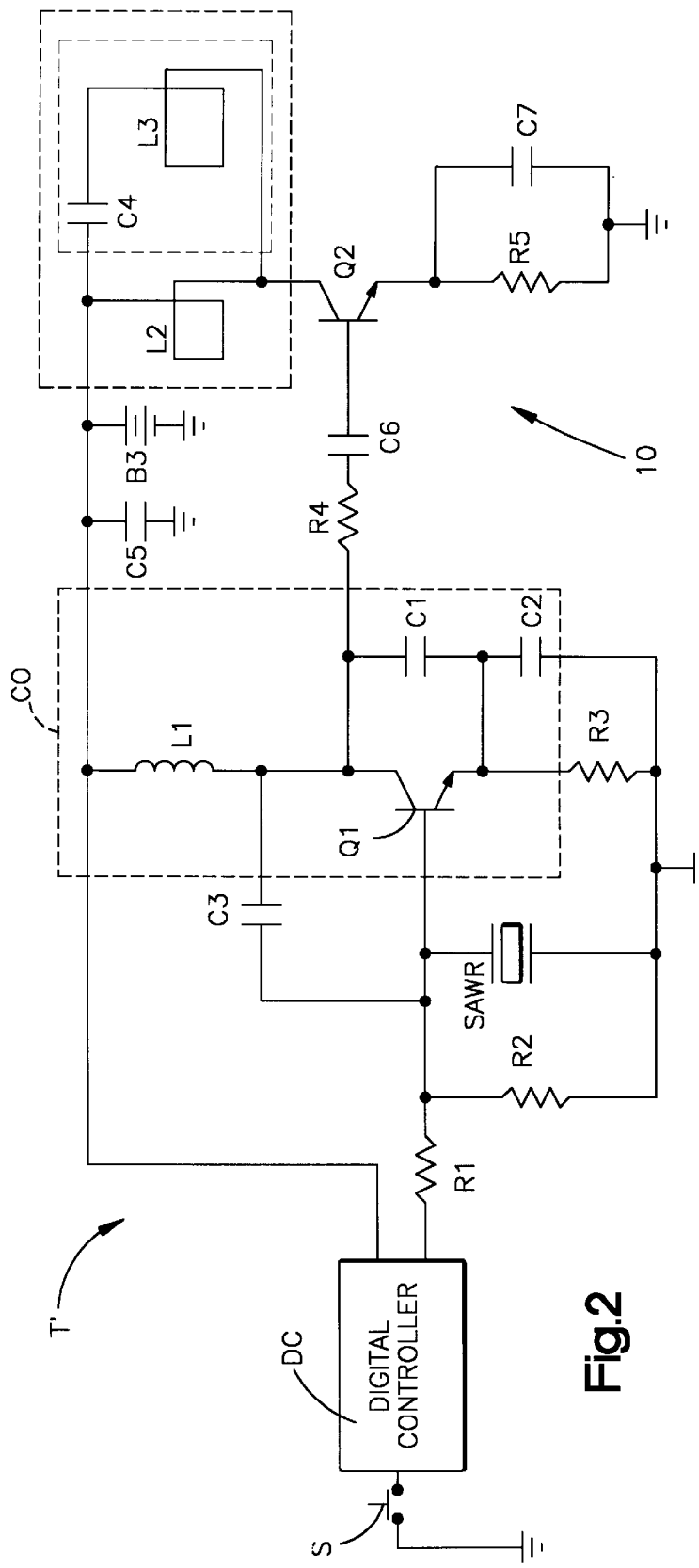
FIG. 2 is a schematic-block diagram illustration of a transmitter constructed in accordance with the present invention.

Before describing the embodiment of the invention as shown in FIG. 2, reference is first made to the prior art transmitter illustrated in FIG. 1. This figure is directed to a hand-held transmitter T suitable for use in a remote keyless entry (RKE) system such as that described in the U.S. patent to Lambropoulos et al U.S. Pat No. 4,881,148 referred to hereinabove. In such a system it is contemplated that there are several similar transmitters each of which is operable to transmit a digital signal to the vehicle receiver. The digital signal includes a security code that identifies a particular transmitter that is transmitting the signal together with a function code that requests the vehicle receiver to perform a requested function, such as opening a vehicle door. The signal is a radio frequency (RF) signal having a carrier frequency of 315 MHz. The digital code in a signal is binary with a binary 1 and a binary 0 being distinguished from each other by a difference in length or duration.

The transmitter T shown in FIG. 1 includes a digital controller DC which provides such a security code and a function code in response to actuation of at least one switch S. The digital signal is supplied to an LC oscillator, such as a Colpitts oscillator CO. This oscillator includes an inductor L1 serving as an antenna for transmitting the radio frequency signal. The carrier wave provided by the oscillator CO is modulated by the digital codes provided by controller DC to provide a chain of binary 1 and binary 0 pulses with each pulse including a radio frequency signal at a carrier wave frequency of 315 MHz.

As shown in FIG. 1 the Colpitts oscillator CO includes a semi-conductor in the form of an NPN transistor Q1 together with a tank circuit including capacitors C1 and C2. Capacitor C1 is connected between the collector and emitter of transistor Q1. Capacitor C2 is connected between the emitter of transistor Q1 and ground. The tank circuit includes inductor L1 together with an additional capacitor C5. Power for operating the digital controller and the Colpitts oscillator is obtained from a voltage source, such as a pair of series connected batteries B1 and B2, each of which may take the form of a 3 volt battery.

The components employed in the Colpitts oscillator are chosen such that the natural frequency of oscillation, as dictated by the tank circuit, is the desired carrier frequency of 315 MHz. The Colpitts oscillator may drift with changes in circuit component values due to temperature changes and the like. It is known in the art that this can be overcome to a substantial extent by employing a saw resonator. The circuit of FIG. 1 includes a saw resonator SAWR connected between the base of transistor Q1 and ground to frequency lock the operation of the oscillator at 315 MHz.

A problem with the prior art circuit of FIG. 1 is the inclusion of two 3 volt batteries B1 and B2 to provide a total of 6 volts to provide operating power for the transmitter. Each battery takes up substantial space. It is desirable to reduce the size of the transmitter housing or fob in order to be more appealing to a customer. Also, a single battery device permits easier battery replacement. However, if the transmitter housing size is reduced by employing only a single 3 volt battery, there is a need to increase the power of such a transmitter to be comparable to that enjoyed by a 6 volt powered transmitter. This may be accomplished by varying the bias circuit of the transistor Q1 in the Colpitts oscillator CO and/or by providing an amplifier between the Colpitts oscillator and an antenna. Such changes increase or amplify spurious frequency signals during the oscillator start-up operation. These spurious frequency signals may interfere with the proper operation of the transmitter and, as a result, the transmitter operation may not meet with approval by the Federal Communications Commission (FCC).

Spurious frequency signals are particularly noticeable during the start-up time of the oscillator. The oscillator is turned on each time it receives a positive pulse from the digital controller. A binary "1" signal may be a positive pulse of a substantial duration, such as 600 microseconds. This may be followed by dwell period of approximately 200 microseconds. Thereafter another binary signal, such as a binary "0" signal may be provided for a duration on the order of 200 microseconds. Each time a positive pulse is provided by the controller (for either a binary 1 or a binary 0 signal) a positive signal is applied through resistor R1 to the base of transistor Q1 in the Colpitts oscillator CO. The oscillator then operates to provide a carrier wave of a desired frequency for the duration of the positive signal.

Each time the oscillator is turned on, a start-up period takes place during which the oscillator is providing spurious signals of frequencies other than the desired carrier wave frequency of 315 MHz. This start-up period may last, for example, for 5 microseconds for the Colpitts oscillator itself. These spurious frequency signals have frequencies close to the desired frequency of 315 MHz. Also, during this period the saw resonator, which has a high Q value, requires sometime before it reaches its operational mode for frequency locking the oscillator at 315 MHz. The time for the resonator to reach its operational mode, during each start-up operation, may be on the order of 20 microseconds. Thereafter, the impedance of this resonator decreases to its minimum level and any spurious frequency signal generated are of a negligible magnitude. Consequently, during the first few microseconds to approximately 20 microseconds of the operation of the oscillator, spurious frequency signals of concern may be generated.

If the bias circuit for the oscillator is adjusted by lowering the magnitude of resistor R3 to provide increased current to compensate for the reduced battery power, from two batteries to one battery, the magnitude of such spurious frequency signals, during the start-up period, will be more pronounced.

If an amplifier is employed between the oscillator and the antenna to compensate for the reduced battery power, then such amplification will increase the magnitude of such spurious frequency signals during the start-up period.

In accordance with the present invention, a capacitive feedback circuit is provided to reduce these spurious signals during the start-up. Once the oscillator is frequency locked by the surface acoustic wave resonator, the feedback capacitor has little effect on the overall oscillator gain.

Reference is now made to FIG. 2 which illustrates an embodiment of the invention constructed in accordance with the present invention. Like components in FIGS. 1 and 2 are identified with like character references to simplify the description herein. Only the differences between FIGS. 1 and 2 will be described below.

The transmitter T of FIG. 2 employs inductor LI as part of the tank circuit only and not also as part of the antenna, as in the case of FIG. 1. In this embodiment, an amplifier 10 is interposed between the antenna and the Colpitts oscillator CO. This amplifier includes resistor R4 connected together in series with a capacitor C6 between the collector of transistor Q1 and the base of an NPN transistor Q2. The emitter circuit of transistor Q2 includes a resistor R5 and a capacitor C7 connected together in parallel between the emitter and ground. The collector of transistor Q2 is connected to a tapped antenna structure including inductors L2 and L3 and a capacitor C4.

In accordance with the present invention, a feedback capacitor C3 is connected between the collector and the base of transistor Q1. This capacitive feedback path reduces the gain of the oscillator during the initial start-up time. Consequently, any spurious signals generated during this time will be at a much lower signal level. Initially, when the oscillator is first turned on, the surface acoustic wave resonator has a high impedance, the base of the transistor is not totally grounded. The oscillator stage acts like an amplifier and amplifies noise. The feedback capacitor C3 reduces the gain of the oscillator during this period and as time passes the impedance of the surface acoustic wave resonator becomes lower. The impedance reaches its minimum level when the oscillator becomes frequency locked to the surface acoustic wave resonator at 315 MHz.

Figure 3:
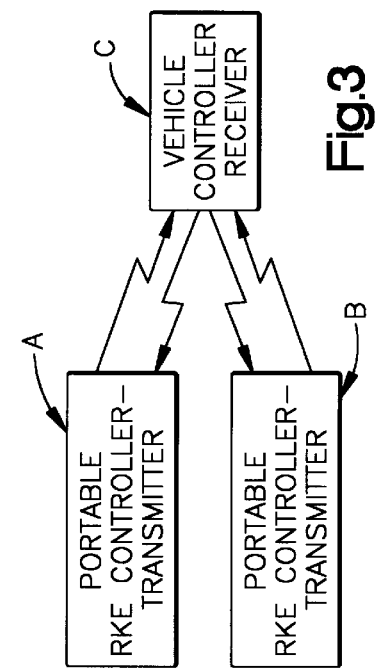
FIG. 3 is a schematic-block diagram illustrating a portable transmitter and a vehicle mounted receiver in accordance with one embodiment of the invention.

Reference is now made to FIG. 3 which illustrates a remote keyless entry (RKE) system employing portable transmitters A and B, each constructed in accordance with the present invention, and a vehicle mounted receiver C. In such a system, each of the remote portable transmitters A and B communicates with vehicle receiver C to achieve remote control of the vehicle doorlock mechanism, as well as other vehicle device functions. The receiver C may take the form of receiver R illustrated and described in the U.S. patent to Lambropoulis et al U.S. Pat. No. 4,881,148, the disclosure of which is herein incorporated by reference. In the example being given herein, transmitters A and B are provided with security codes SC-A and SC-B, respectively, which will permit entry into the vehicle in which is mounted receiver C. As illustrated in FIG. 2 each transmitter transmits a digital signal in response to actuation of a switch S. This digital signal includes a security code as well as a function code requesting a particular vehicle device function, such as unlocking of a vehicle door. The vehicle receiver includes a microcomputer and has a memory that stores one or more security codes each of which uniquely identifies a transmitter that is authorized entry into the vehicle. If the received signal includes a coded portion that matches the stored security code, then the receiver initiates action to perform the commanded vehicle function.

The transmitters may also be employed in a passive RKE system wherein the operator need not push a switch button on the remote transmitter in order to transmit a coded signal to the vehicle receiver to unlock a vehicle door or the like. Instead, such a system employs transmitters that each periodically transmits a coded signal which is received by the vehicle receiver to cause performance of a vehicle function, such as opening a vehicle door. The function takes place once the transmitter is in the operating range of the vehicle receiver. The coded digital signals include a security code as well as a function code as in the case described above. Such a passive system has particular application as a hands-free system.

From the above description of the invention, those skilled in the art will perceive improvements, changes and modifications. Such improvements, changes and modifications within the skill of the art are intended to be covered by the appended claims.

Having described the invention, we claim the following:

1. A transmitter for use with a receiver responsive to a function request signal transmitted by said transmitter for performing a requested function, comprising:

a controller for providing a function command;

a LC oscillator for providing said request signal at a fixed frequency in response to each occurrence of a said command and for the duration of said command from said controller and including a semi-conductor having first, second, and third electrodes and a tank circuit including first and second impedances, said first impedance being connected between the second and third electrodes, said second impedance being connected from the third electrode to ground, and a third impedance being connected from a voltage source to said second electrode;

a surface acoustic wave resonator connected from said first electrode to ground and operative in response to each said command for locking said oscillator to operate at said fixed frequency upon completion of a start up period initiated by the commencement of each said command and during which start up period said oscillator provides spurious frequency signals at frequencies other than said fixed frequency; and a feedback capacitor connected from said second electrode to said first electrode for reducing said spurious frequency signals during said start up period.

2. A transmitter as set forth in claim 1, including amplifying means for amplifying said request signal provided by said oscillator.

3. A transmitter as set forth in claim 1, including an antenna.

4. A transmitter as set forth in claim 3, including amplifying means interposed between said oscillator and said antenna for amplifying said request signal.

5. A transmitter as set forth in claim 1, wherein said semi-conductor is an NPN transistor and wherein said first, second, and third electrodes are respectfully a collector, an emitter, and a base.

6. A transmitter as set forth in claim 5, including amplifying means for amplifying said request signal provided by said oscillator.

7. A transmitter as set forth in claim 5, including an antenna.

8. A transmitter as set forth in claim 7, including amplifying means interposed between said oscillator and said antenna for amplifying said request signal.

9. A transmitter as set forth in claim 1, wherein said LC oscillator is a Colpitts oscillator.

10. A transmitter as set forth in claim 9, wherein said first and second impedances are first and second capacitors and wherein said third impedance is an inductor.

11. A transmitter as set forth in claim 1, including a function request switch and wherein said controller is responsive to operation of said switch for providing a said function command.

12. A transmitter as set forth in claim 1, for use with a remote keyless entry system having a said receiver responsive to a vehicle function request signal transmitted by said transmitter for performing a requested vehicle function.

* * * * *